United States Patent
Fisher

(10) Patent No.: US 11,101,580 B1
(45) Date of Patent: Aug. 24, 2021

(54) REMOTE DISCONNECTION AND MONITORING OF AC MITIGATION SYSTEMS EMPLOYED WITH BURIED CONDUCTIVE STRUCTURES

(71) Applicant: OmniMetrix, LLC, Buford, GA (US)

(72) Inventor: Carey I Fisher, Duluth, GA (US)

(73) Assignee: OmniMetrix, LLC, Buford, GA (US)

( * ) Notice: Subject to any disclaimer, the term of this patent is extended or adjusted under 35 U.S.C. 154(b) by 0 days.

(21) Appl. No.: 16/997,258

(22) Filed: Aug. 19, 2020

(51) Int. Cl.
| | | |
|---|---|---|
| H01R 4/64 | (2006.01) | |
| H01F 38/30 | (2006.01) | |
| H01R 4/66 | (2006.01) | |
| G01R 31/52 | (2020.01) | |
| F16L 25/01 | (2006.01) | |

(52) U.S. Cl.
CPC ............ *H01R 4/643* (2013.01); *G01R 31/52* (2020.01); *H01F 38/30* (2013.01); *H01R 4/66* (2013.01); *F16L 25/01* (2013.01)

(58) Field of Classification Search
None
See application file for complete search history.

(56) References Cited

U.S. PATENT DOCUMENTS

| | | | | |
|---|---|---|---|---|
| 9,774,105 | B2 * | 9/2017 | Moghbeli | ................ H01R 4/66 |
| 10,992,137 | B2 * | 4/2021 | Land | ........................ F17D 5/08 |
| 2011/0238347 | A1 * | 9/2011 | Gemperli | ................ C23F 13/04 |
| | | | | 702/65 |
| 2017/0220057 | A1 * | 8/2017 | Jachim | ...................... G05F 1/12 |

* cited by examiner

*Primary Examiner* — Ross N Gushi
(74) *Attorney, Agent, or Firm* — Kenneth W. Float

(57) ABSTRACT

Systems, apparatus, and methods for use with an AC mitigation device coupled to an underground conductive structure and to one or more buried AC mitigation conductors adjacent to the underground structure. AC current transformers sense AC flowing between the mitigation device and the underground structure, and between the mitigation device and the mitigation conductors. A controllable switch is coupled between the mitigation device and the underground structure. Digitizing circuitry generates digital data corresponding to the AC sensed by the current transformers when the mitigation device is connected to and disconnected from the underground structure. Wireless communication circuitry processes signals received from a remote site to control the switch to selectively disconnect and reconnect the mitigation device from and to the underground structure to produce AC current signals indicative of mitigation device operation, and transmits the digital data to the remote site for processing to remotely test the AC mitigation device.

17 Claims, 2 Drawing Sheets

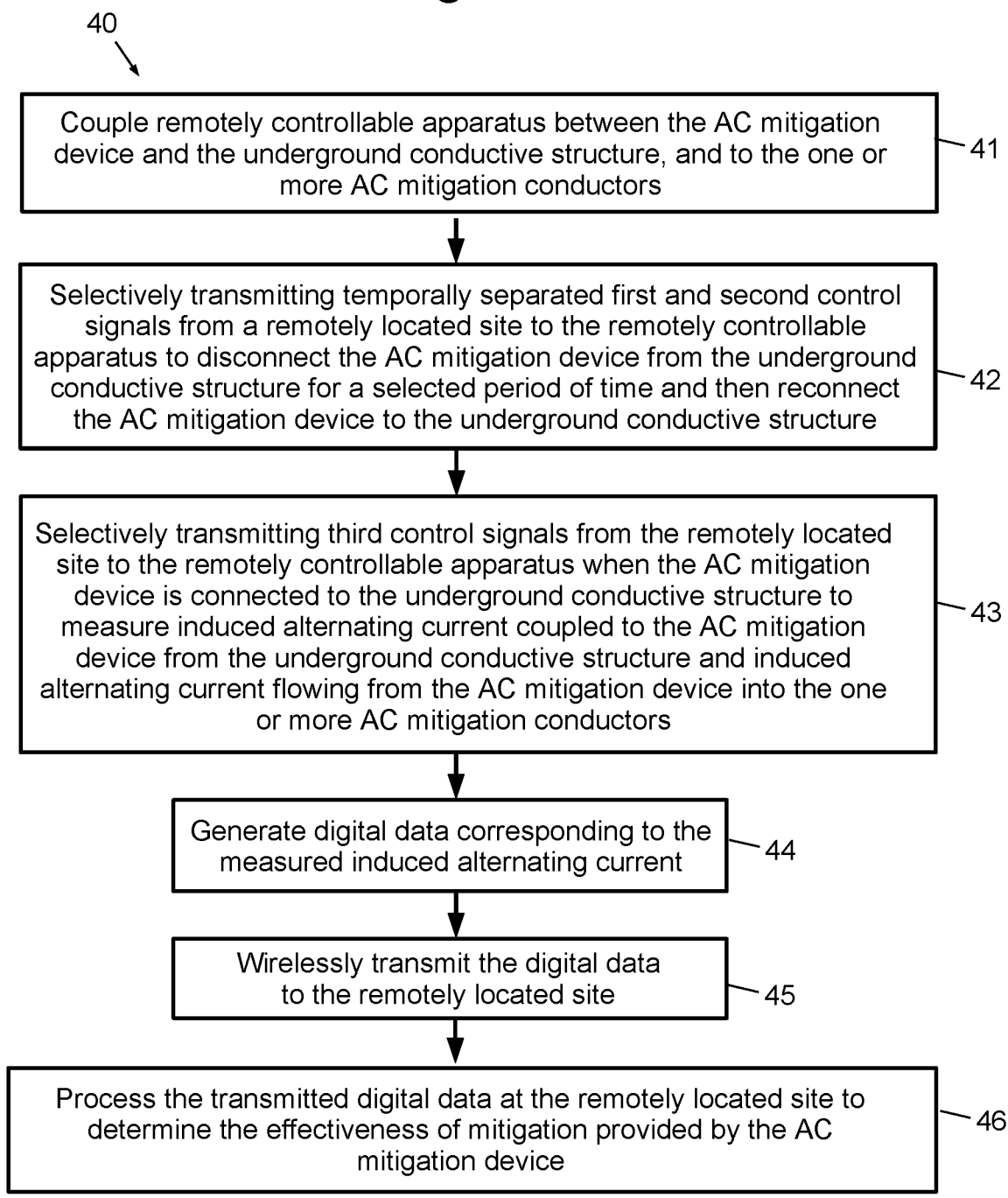

REMOTE DISCONNECTION AND MONITORING OF AC MITIGATION SYSTEMS EMPLOYED WITH BURIED CONDUCTIVE STRUCTURES

BACKGROUND

The present invention relates generally to systems, apparatus and methods for remotely controlling and testing AC mitigation systems coupled to buried, or underground, conductive structures, and more particularly, to systems, apparatus and methods that remotely disconnects, reconnects, and tests alternating current (AC) mitigation systems used with buried conductive structures, such as pipelines, and the like.

Pipelines that run in right-of-ways alongside power lines are susceptible to having AC current induced on them from nearby power lines. Problems with induced AC on a pipe or other buried conductive structure are that AC voltage on the pipe can be hazardous to workers touching the pipe, and AC current causes a type of corrosion of the pipe.

To mitigate the induced AC, various AC mitigation devices are used to divert the AC directly into the earth. The AC mitigation devices include solid state decouplers (SSDs) and polarization cell replacements (PCRs). The AC mitigation devices are connected between the pipe and grounding strips (AC mitigation conductors) buried in the earth next to the pipe. The AC mitigation devices only let AC flow through them, and thus have no effect on any direct current (DC) cathodic protection potential applied to the pipe.

The AC mitigation devices are placed at intervals along the pipeline suitable for the task, and such intervals are determined by measurement and modeling by engineers. Since pipelines can stretch for many miles, many AC mitigation devices are necessary.

When doing required periodic testing of the cathodic protection on the pipe, the AC mitigation devices must be disconnected from the pipe. This has heretofore required a person in a vehicle or on foot to travel the length of the pipe to each AC mitigation device to disconnect them and then reconnect them after testing is complete.

Additionally, periodic testing of the AC mitigation devices is necessary to determine whether the AC mitigation devices are still effective at mitigating the AC induced on the pipe. This requires a visit to each AC mitigation device site where measurements are taken to establish the effectiveness of the devices.

It would therefore be desirable to have apparatus and methods for remotely disconnecting and reconnecting alternating current (AC) mitigation apparatus coupled to buried (underground) conductive structures, such as pipelines, and the like. It would also be desirable to have apparatus and methods for remotely monitoring and testing AC mitigation systems coupled to buried structures, such as pipelines, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates exemplary alternating current (AC) mitigation apparatus in accordance with the principles of the present invention for remotely controlling and testing buried conductive structures such as pipelines, and the like; and FIG. 2 is a flow chart illustrating exemplary AC mitigation methods in accordance with the principles of the present invention for remotely controlling and testing AC mitigation apparatus used with buried conductive structures, such as pipelines, and the like.

DETAILED DESCRIPTION

Figure 1:
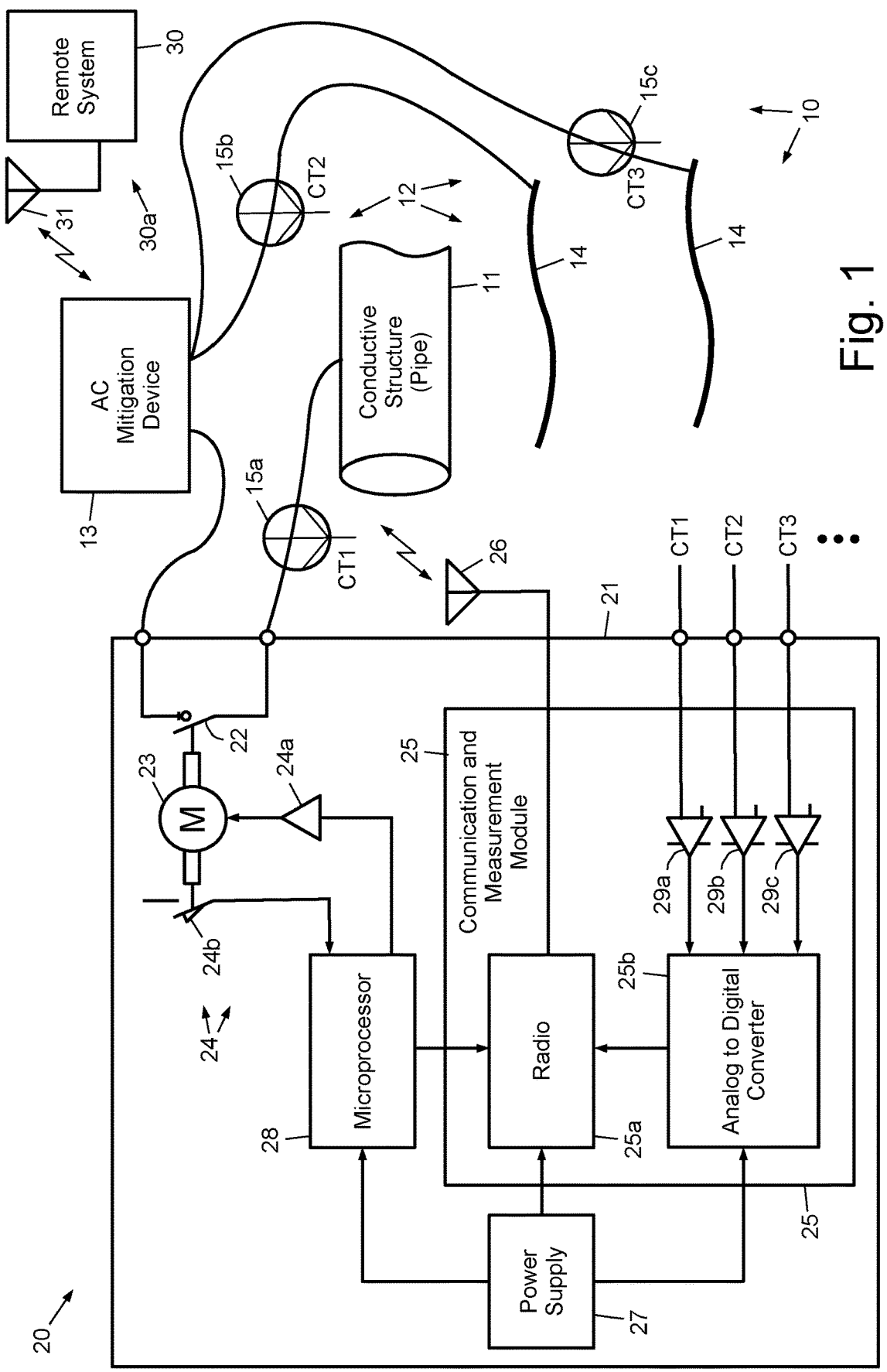

Referring to the drawing figures, FIG. 1 illustrates an exemplary system 10 and apparatus 20 for remotely controlling and testing alternating current (AC) mitigation devices 13 coupled to buried conductive structures 11, such as pipelines 11, and the like. The exemplary system 10 and apparatus 20 shown in FIG. 1 provides for remote monitoring, disconnection, reconnection, and testing of the AC mitigation devices 13 coupled to such buried conductive structures 11. The apparatus 20 thus comprises remotely controlled, remote monitoring, disconnection, and reconnection, AC mitigation device testing apparatus 20.

As is illustrated in FIG. 1, the exemplary system 10 comprises an AC mitigation system 12 comprising the AC mitigation device 13 coupled between the buried conductive structure 11 (pipe 11) and one or more grounding strips 14 (AC mitigation conductors 14) buried in the earth next to the pipe 11. In this exemplary embodiment, the AC mitigation device 13 is coupled to two grounding strips 14b, 14c (AC mitigation conductors 14b, 14c) located along the length of the buried conductive structure 11 (pipe 11). It is to be understood that the number of AC mitigation conductors 14b, 14c that are used is generally determined by the length of the pipe 11. Exemplary AC mitigation devices 13 include solid state decouplers (SSDs) and polarization cell replacements (PCRs). AC current transformers 15a, 15b, 15c are coupled between the AC mitigation device 13 and the buried conductive structure 11 (pipe 11), and between the AC mitigation device 13 and the grounding strips 14b, 14c (AC mitigation conductors 14b, 14c).

The remotely controlled, remote monitoring, disconnection, and testing apparatus 20 includes a housing 21 comprising a switch 22, which is preferably a mechanically controlled switch 22, such as a motor operated switch 22, or solenoid controlled switch 22, for example, that is coupled between the AC mitigation device 13 and a grounding strip 14. Thus, the mechanically controlled switch 22 is a switch 22 that is controlled by a motor, solenoid, or other motion controlling device or apparatus. In the exemplary embodiment, a gear motor 23 is coupled to a motor operated switch 22 and is coupled to and controlled by a motor controller 24 comprising a motor driver 24a and a motor position sensor 24b. The motor controller 24 is coupled to a microprocessor 28 which controls movement of the gear motor 23 in conjunction with the motor position sensor 24b. The gear motor 23 and the switch 22 are used to disconnect and reconnect the AC mitigation device 13 from and to the buried conductive structure 11 (pipe 11). A microprocessor controlled communication and measurement module 25 having an antenna 26 is coupled to the motor controller 24. A power supply 27 is coupled to the motor controller 24 and the microprocessor controlled communication and measurement module 25.

The remotely controlled, remote monitoring, disconnection, and testing apparatus 20 is coupled to a remote monitoring and control system 30. This coupling is preferably achieved using wireless communication protocols. Preferably, cellular, satellite, or other radio communication data connections as appropriate, is used to communicate between the remotely controlled, remote monitoring, disconnection, and testing apparatus 20 and the remote monitoring and control system 30, due to the relatively long distance between the remotely controlled, remote monitoring, disconnection, and testing apparatus 20 and the remote monitoring and control system 30. However, other wireless or wired data communication protocols may also be employed if the case arises.

The AC current transformers 15a, 15b, 15c are coupled by way of a corresponding number of integrators 29a, 29b, 29c to an analog to digital converter 25b. The analog to digital converter 25b is coupled to and provides inputs to the microprocessor 28. The power supply 27 supplies power to the analog to digital converter 25b and the microprocessor 28.

The microprocessor 28 is coupled to a wireless communication device 26a, such as a cellular radio 25a, for example, which includes an antenna 26 for communicating with the remote monitoring and control system 30. The radio 25a is coupled to and receives power from the power supply 27.

The microprocessor 28 is programmed to disconnect the AC mitigation apparatus 20 and reconnect it on demand (i.e., control signals transmitted from the monitoring and control system 30 located at a remote site 30a). The programming is also configured to measure the alternating current flowing through the AC mitigation apparatus 20 to determine if it is working properly.

When periodically testing cathodic protection on the pipe 11, any AC mitigation devices 11 coupled to the pipe 11 are disconnected from the pipe 11. This is achieved using the AC mitigation apparatus 20 (remotely controlled, remote monitoring, disconnection, and testing apparatus 20). The AC mitigation apparatus 20 is remotely controlled from the remote system 30 to disconnect the AC mitigation devices 13 from the pipe 11 for a predetermined period of time while the cathodic protection testing is performed. Once the cathodic protection testing is completed, the AC mitigation apparatus 20 is remotely controlled from the remote monitoring and control system 30 to reconnect the AC mitigation devices 13 to the pipe 11. Interruption of induced alternating current from the AC mitigation device 13 is achieved using the gear motor 23 and motor position sensor 24b, controlled using the motor controller 24 and microprocessor 28 to disconnect and reconnect the AC mitigation device 13 from and to the pipe 11.

When testing the effectiveness of an AC mitigation device 13, alternating current induced along the pipe 11 is monitored by measuring analog alternating current flowing through the AC mitigation device 13 into the grounding strips 14 coupled to the AC mitigation device 13 using the current transformers 15a, 15b, 15c, converting measured analog current readings into digital data, communicating the digital data to the remote monitoring and control system 30, and observing the decay of voltage on the buried conductive structures 14 (grounding strips 14) at the remote monitoring and control system 30.

FIG. 2 is a flow chart illustrating exemplary methods 40 in accordance with the principles of the present invention involving remotely controlling and testing AC mitigation apparatus 13 used with buried conductive structures 11, such as pipelines 11, and the like. Exemplary methods 40 may be implemented as follows.

The exemplary methods 40 are used to remotely control an alternating current (AC) mitigation device 13 coupled to an underground conductive structure 11 and coupled to one or more AC mitigation conductors 14 buried in earth adjacent to the underground conductive structure 11. The exemplary methods comprise coupling 41 remotely controllable apparatus 20 between the AC mitigation device 13 and the underground conductive structure 11, and to the one or more AC mitigation conductors 14.

Temporally separated first and second control signals are selectively transmitted 42 from a remotely located site 30a to the remotely controllable apparatus 20 to disconnect the AC mitigation device 13 from the underground conductive structure 11 for a selected period of time and then reconnect the AC mitigation device 13 to the underground conductive structure 11. This provides for cathodic protection testing of the underground conductive structure 11, for example.

Third control signals are selectively transmitted 43 from the remotely located site 30a to the remotely controllable apparatus 20 when the AC mitigation device 13 is connected to the underground conductive structure 11 to measure induced alternating current coupled to the AC mitigation device 13 from the underground conductive structure 11 and induced alternating current flowing from the AC mitigation device 13 into the one or more AC mitigation conductors 14. Digital data is generated 44 corresponding to the measured induced alternating current. The digital data is wirelessly transmitted 45 to the remotely located site 30a. The digital data transmitted to the remotely located site 30a is processed 46 at the remotely located site 30a to determine the effectiveness of mitigation provided by the AC mitigation device 13.

Thus, systems 10, apparatus 20 and methods 40 have been disclosed that provide for remote disconnection and reconnection of an AC mitigation device 13 coupled to an underground conductive structure 11 to permit cathodic protection testing, for example, along with testing of the operability or effectiveness of the AC mitigation device 14 in mitigating the alternating current induced on the underground conductive structure 11. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. Apparatus for use with an alternating current (AC) mitigation device coupled to an underground conductive structure and coupled to one or more AC mitigation conductors buried in earth adjacent to the underground conductive structure, comprising:

one or more AC current transformers for sensing alternating current flowing between the AC mitigation device and the underground conductive structure, and between the AC mitigation device and respective ones of the one or more AC mitigation conductors;

a controllable switch for selectively disconnecting and reconnecting the AC mitigation device from and to the underground conductive structure;

digitizing circuitry for generating digital data corresponding to the alternating current sensed by the respective AC current transformers when the AC mitigation device is connected to and disconnected from the underground conductive structure; and wireless communication circuitry for receiving signals from a remotely located site that control the switch to selectively disconnect and reconnect the AC mitigation device from and to the underground conductive structure to produce AC current signals indicative of operation of the AC mitigation device, and for transmitting the digital data corresponding to alternating current sensed by the respective AC current transformers to the remotely located site for processing to remotely test the AC mitigation device.

2. The apparatus recited in claim 1 wherein the switch comprises a mechanically operated switch.

3. The apparatus recited in claim 1 wherein the motor operated switch is controlled by a gear motor.

4. The apparatus recited in claim 1 wherein the digital data comprises cellular or satellite radio communication data.

5. The apparatus recited in claim 1 wherein the AC mitigation device comprises a solid state decoupler or polarization cell replacement device.

6. The apparatus recited in claim 1 wherein the switch comprises a motor or solenoid operated switch.

7. A system for use with an alternating current (AC) mitigation device coupled to an underground conductive structure and coupled to one or more AC mitigation conductors buried in earth adjacent to the underground conductive structure, comprising:
   one or more AC current transformers for sensing alternating current flowing between the AC mitigation device and the underground conductive structure, and between the AC mitigation device and respective ones of the one or more AC mitigation conductors;
   remotely controllable apparatus comprising:
   a controllable switch for disconnecting and reconnecting the AC mitigation device from and to the underground conductive structure in response to control signals generated at a remotely located site;
   digitizing circuitry for generating digital data corresponding to the alternating current sensed by the respective AC current transformers when the AC mitigation device connected to and disconnected from the underground conductive structure; and
   wireless communication circuitry for receiving signals from the remotely located site that control the switch to selectively disconnect and reconnect the AC mitigation device from and to the underground conductive structure to produce AC current signals indicative of operation of the AC mitigation device, and for transmitting the digital data corresponding to alternating current sensed by the respective AC current transformers to the remotely located site for processing to remotely test the AC mitigation device; and
   a control system located at the remotely located site that comprises circuitry and software for generating the control signals that selectively disconnect and reconnect the AC mitigation device from and to the underground conductive structure, and wireless communication circuitry and software for transmitting and receiving signals to and from the remotely controllable apparatus.

8. The system recited in claim 7 wherein the switch comprises a mechanically operated switch.

9. The system recited in claim 7 wherein the motor operated switch is controlled by a gear motor.

10. The system recited in claim 7 wherein the digital data comprises cellular or satellite, radio communication data.

11. The system recited in claim 7 wherein the AC mitigation device comprises a solid state decoupler or polarization cell replacement device.

12. The system recited in claim 7 wherein the switch comprises a motor or solenoid operated switch.

13. A method of remotely controlling an alternating current (AC) mitigation device coupled to an underground conductive structure and coupled to one or more AC mitigation conductors buried in earth adjacent to the underground conductive structure, comprising:
   coupling remotely controllable apparatus between the AC mitigation device and the underground conductive structure, and to the one or more AC mitigation conductors;
   selectively transmitting temporally separated first and second control signals from a remotely located site to the remotely controllable apparatus to disconnect the AC mitigation device from the underground conductive structure for a selected period of time and then reconnect the AC mitigation device to the underground conductive structure;
   selectively transmitting third control signals from the remotely located site to the remotely controllable apparatus when the AC mitigation device is connected to the underground conductive structure to measure induced alternating current coupled to the AC mitigation device from the underground conductive structure and induced alternating current flowing from the AC mitigation device into the one or more AC mitigation conductors;
   generating digital data corresponding to the measured induced alternating current;
   wirelessly communicating the digital data to the remotely located site; and
   processing the digital data at the remotely located site to determine the effectiveness of mitigation provided by the AC mitigation device.

14. The method recited in claim 13 wherein measurement of the induced alternating current comprises sensing current flowing to and from the AC mitigation device uses AC current transformers.

15. The method recited in claim 13 wherein generating the digital data comprises integrating signals corresponding to the measured induced alternating current and digitizing the integrated signals.

16. The method recited in claim 14 wherein generating the digital data comprises integrating signals corresponding to the measured induced alternating current and digitizing the integrated signals.

17. The method recited in claim 13 wherein the AC mitigation device comprises a solid state decoupler or polarization cell replacement device.

* * * * *